(12) United States Patent
Lin

(10) Patent No.: US 12,319,581 B2
(45) Date of Patent: Jun. 3, 2025

(54) METHOD OF FABRICATING SILICON CARBIDE MATERIAL BY PERFORMING A FIRST ANNEALING PROCESS TO CONTROL AVERAGE RESISTIVITY

(71) Applicant: GlobalWafers Co., Ltd., Hsinchu (TW)

(72) Inventor: Ching-Shan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 863 days.

(21) Appl. No.: 17/385,940

(22) Filed: Jul. 27, 2021

(65) Prior Publication Data

US 2022/0024773 A1 Jan. 27, 2022

Related U.S. Application Data

(60) Provisional application No. 63/056,733, filed on Jul. 27, 2020.

(51) Int. Cl.
| | | |
|---|---|---|
| *C30B 33/02* | (2006.01) | |
| *C01B 32/956* | (2017.01) | |
| *C23C 14/06* | (2006.01) | |
| *C23C 14/58* | (2006.01) | |
| *C30B 29/36* | (2006.01) | |
| *H10D 62/832* | (2025.01) | |

(52) U.S. Cl.
CPC ........ *C01B 32/956* (2017.08); *C23C 14/0635* (2013.01); *C23C 14/5806* (2013.01); *C30B 29/36* (2013.01); *C30B 33/02* (2013.01); *C01P 2006/40* (2013.01); *H10D 62/8325* (2025.01)

(58) Field of Classification Search
CPC ......... C30B 23/00; C30B 23/02; C30B 25/00; C30B 25/02; C30B 29/00; C30B 29/10; C30B 29/36; C30B 33/00; C30B 33/02; C01B 32/956; C23C 14/0635; C23C 14/5806; C01P 2006/40; H01L 29/1608
USPC ............................ 117/2–3, 84, 88, 937, 951
See application file for complete search history.

(56) References Cited

U.S. PATENT DOCUMENTS

| | | | | |
|---|---|---|---|---|
| 6,436,361 | B1 * | 8/2002 | Kamisuki | ............... C30B 29/36 423/346 |
| 2003/0233975 | A1 * | 12/2003 | Jenny | ...................... C30B 33/00 117/30 |

FOREIGN PATENT DOCUMENTS

| | | |
|---|---|---|
| CN | 109234802 | 1/2019 |
| CN | 109338463 | 2/2019 |

(Continued)

OTHER PUBLICATIONS

"Office Action of Taiwan Counterpart Application", issued on May 27, 2022, p. 1-p. 8.

(Continued)

*Primary Examiner* — Kenneth A Bratland, Jr.
(74) *Attorney, Agent, or Firm* — JCIPRNET

(57) ABSTRACT

A method of fabricating a silicon carbide material is provided. The method includes the following steps. A first annealing process is performed on a wafer or on an ingot that forms the wafer after wafer slicing. The conditions of the first annealing process include: a heating rate of 10° C./minute to 30° C./minute, an annealing temperature of 2000° C. or less, and a constant temperature annealing time of 2 minutes or more and 4 hours or less for performing the first annealing process. After performing the first annealing process, an average resistivity of the wafer or the ingot is greater than $10^{10}$ Ω·cm.

9 Claims, 5 Drawing Sheets

(56) References Cited

FOREIGN PATENT DOCUMENTS

| | | | | | |
|---|---|---|---|---|---|
| CN | 109338463 | A | * | 2/2019 | ........... C30B 23/025 |
| KR | 20160049432 | | | 5/2016 | |

OTHER PUBLICATIONS

"Office Action of China Counterpart Application", issued on Mar. 26, 2025, p. 1-p. 6.

* cited by examiner

METHOD OF FABRICATING SILICON CARBIDE MATERIAL BY PERFORMING A FIRST ANNEALING PROCESS TO CONTROL AVERAGE RESISTIVITY

CROSS-REFERENCE TO RELATED APPLICATION

This application claims the priority benefit of U.S. provisional application Ser. No. 63/056,733, filed on Jul. 27, 2020. The entirety of the above-mentioned patent application is hereby incorporated by reference herein and made a part of this specification.

BACKGROUND

Technical Field

The disclosure relates to a method of fabricating a silicon carbide material, and particularly relates to a method of fabricating a silicon carbide material with high-resistivity.

Description of Related Art

Generally, in order for high-purity crystals to have high resistance values, a rapid annealing of 30° C./min to 150° C./min that produces point defects needs to be performed in a high-temperature environment at 2000° C. to 2400° C. to produce the electrical characteristics of high-resistivity. However, when performing annealing at a temperature higher than 2000° C., it is easy to deteriorate the quality of the crystal or wafer or cause cracking in the crystal or wafer.

Therefore, it is an urgent issue to improve the resistivity of the crystal/wafer while avoiding quality deterioration or cracking of the crystal/wafer.

SUMMARY

The disclosure is directed to a method of fabricating a silicon carbide material (for example, a wafer or a crystal), which is adapted to improve resistivity of the crystal/wafer while avoiding quality deterioration or cracking of the crystal/wafer.

The disclosure provides a method of fabricating a silicon carbide material including following steps. A first annealing process is performed on a wafer or on a crystal. Conditions of the first annealing process include: a heating rate of 10° C./min to 30° C./min, an annealing temperature of 2000° C. or less, and a constant temperature annealing time of 2 minutes or more and 4 hours or less for performing the first annealing process. After performing the first annealing process, an average resistivity of the wafer or the crystal is greater than $10^{10}$ $\Omega \cdot$cm.

In an embodiment of the disclosure, the first annealing process is performed on the crystal, and the average resistivity of the wafer formed by the crystal after wafer slicing is greater than $10^{10}$ $\Omega \cdot$cm.

In an embodiment of the disclosure, the method further includes polishing the wafer formed after wafer slicing and then performing a second annealing process. Conditions of the second annealing process include: a heating rate of 10° C./min to 30° C./min, an annealing temperature of 2000° C. or less, and a constant temperature annealing time of 2 minutes or more for performing the second annealing process.

In an embodiment of the disclosure, the first annealing process is performed on the wafer, and the first annealing process is performed on the wafer after the wafer is polished.

In an embodiment of the disclosure, the annealing temperature ranges from 1950° C. to 2000° C.

In an embodiment of the disclosure, the annealing temperature ranges from 1950° C. to 1980° C.

In an embodiment of the disclosure, the heating rate is 25° C./min to 30° C./min, and the part of the wafer or the crystal with the average resistivity greater than $5*10^{11}$ $\Omega \cdot$cm occupies 100% of an area of the wafer or the crystal.

In an embodiment of the disclosure, the heating rate is 22° C./min to 26° C./min, and the part of the wafer or the crystal with the average resistivity greater than $10^{11}$ $\Omega \cdot$cm occupies 100% of an area of the wafer or the crystal.

In an embodiment of the disclosure, the heating rate is 20° C./min to 24° C./min, and the part of the wafer or the crystal with the average resistivity greater than $5*10^{10}$ $\Omega \cdot$cm occupies 100% of an area of the wafer or the crystal.

In an embodiment of the disclosure, the heating rate is 10° C./min to 20° C./min, and the part of the wafer or the crystal with the average resistivity greater than $10^{10}$ $\Omega \cdot$cm occupies 100% of an area of the wafer or the crystal.

The disclosure further provides a silicon carbide material, the silicon carbide material includes a wafer or a crystal, and the part of the wafer or the crystal with an average resistivity greater than $10^{10}$ $\Omega \cdot$cm occupies 100% of an area of the wafer or the crystal.

In an embodiment of the disclosure, the part of the wafer or the crystal with the average resistivity greater than $5*10^{10}$ $\Omega \cdot$cm occupies 100% of an area of the wafer or the crystal.

In an embodiment of the disclosure, the part of the wafer or the crystal with the average resistivity greater than $10^{11}$ $\Omega \cdot$cm occupies 100% of an area of the wafer or the crystal.

In an embodiment of the disclosure, the part of the wafer or the crystal with the average resistivity greater than $5*10^{11}$ $\Omega \cdot$cm occupies 100% of an area of the wafer or the crystal.

Based on the above description, by adopting the fabrication method of the silicon carbide material of the embodiment of the disclosure, atoms in the silicon carbide material may be arranged more orderly, and the resistivity of the wafer/crystal may be improved. In addition, by reducing the annealing temperature and the heating rate of the annealing process, the resistivity may be increased while avoiding the quality deterioration or cracking of the crystal/wafer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
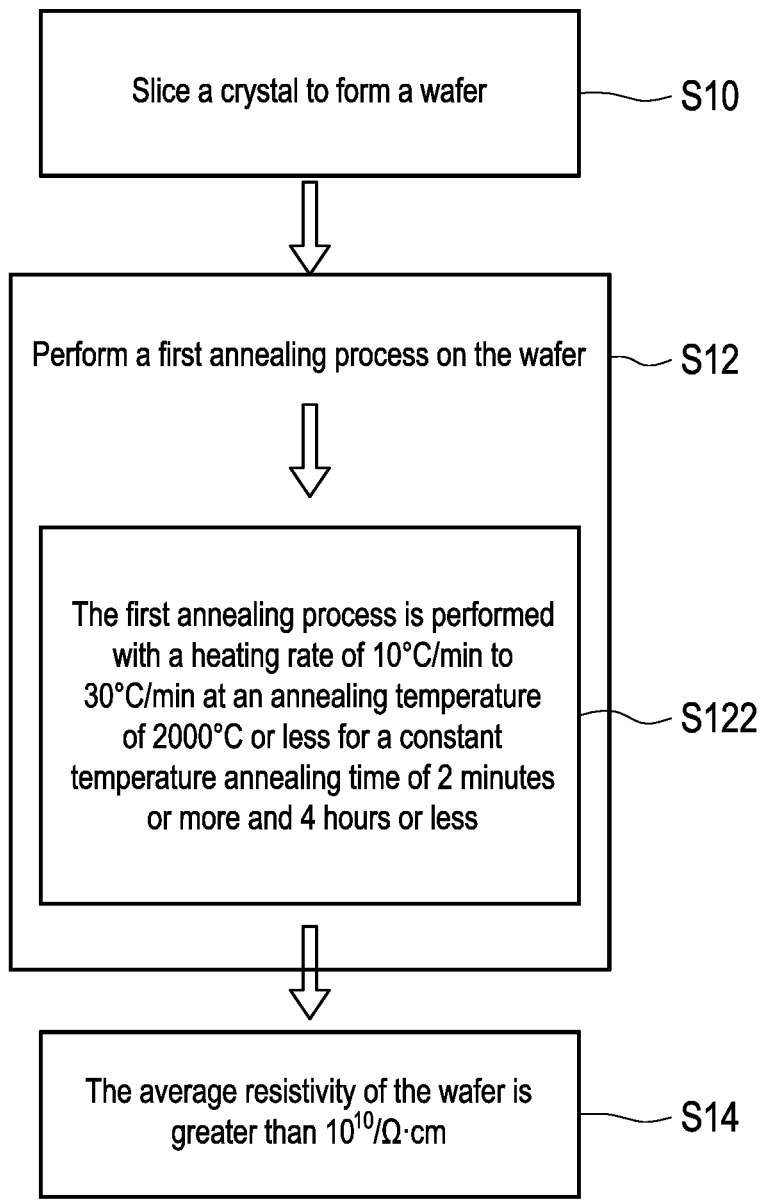
FIG. 1 is a flowchart of a method of fabricating a silicon carbide material according to an embodiment of the disclosure.
Figure 2A:
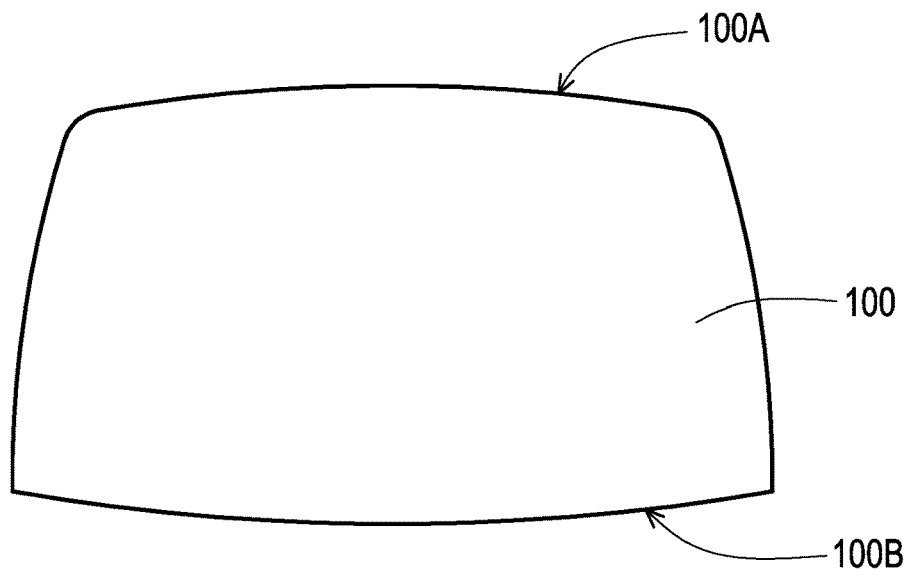
FIG. 2A to FIG. 2C are schematic cross-sectional views of the method of fabricating the silicon carbide material according to some embodiments of the disclosure.
Figure 2B:
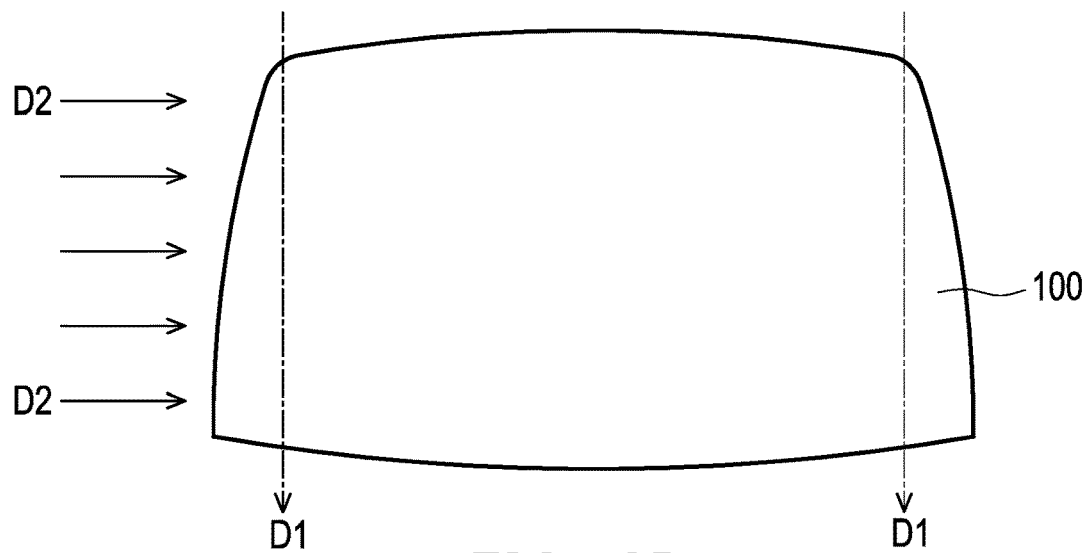
Figure 2C:
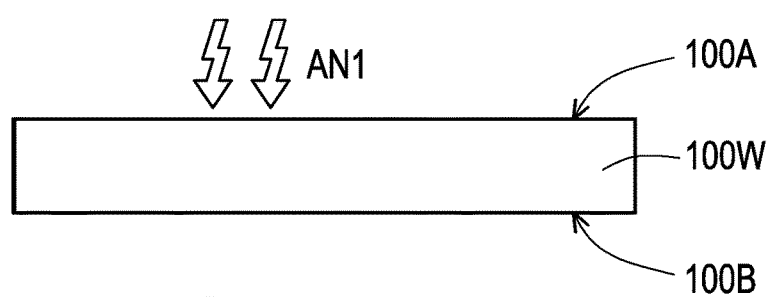

FIG. 1 is a flowchart of a method of fabricating a silicon carbide material according to an embodiment of the disclosure. FIG. 2A to FIG. 2C are schematic cross-sectional views of the method of fabricating the silicon carbide material according to some embodiments of the disclosure. Hereinafter, the method of fabricating the silicon carbide material of the embodiment of the disclosure will be described below with reference to the steps in FIG. 1 and the schematic cross-sectional views of FIG. 2A to FIG. 2C.

Referring to step S10 of FIG. 1 and FIG. 2A and FIG. 2B, a crystal 100 obtained through a crystal growth process is sliced to form a wafer. As shown in FIG. 2A, the crystal 100 may be formed through a conventional crystal growth process. In some embodiments, the crystal 100 or an ingot may be formed through a physical vapor transport method via induction heating in a high-temperature furnace to volatilize a silicon carbide solid raw material for depositing on a seed crystal surface for growing and thickening. The crystal 100 or ingot may have different crystal structures depending on a manufacturing method, a manufacturing material, and a crystal orientation of the seed crystal. For example, silicon carbide crystals/ingots include 4H-silicon carbide, 6H-silicon carbide, etc. 4H-silicon carbide and 6H-silicon carbide belong to a hexagonal crystal system. In some embodiments, the crystal 100 includes a first surface 100A and a second surface 100B opposite to the first surface 100A. The first surface 100A is, for example, a carbon surface, and the second surface 100B is, for example, a silicon surface.

As shown in FIG. 2B, after the growth of the crystal 100 is completed, the crystal 100 is sliced. For example, sides and corners of the crystal 100 are cut along a first direction D1 to obtain an equal-diameter cylinder, and then the crystal 100 is ground into round corners to prevent sides and corners of the crystal 100 from being broken due to collision. Then, the crystal 100 is sliced along a second direction D2 to obtain a plurality of wafers. The slicing method of the crystal 100 includes slicing with a knife or a steel wire in collaboration with abrasive particles (abrasive particles such as diamond particles). After the crystal 100 is sliced and ground and polished, a plurality of silicon carbide wafers 100W as shown in FIG. 2C may be obtained.

Then, referring to step S12 of FIG. 1 and as shown in FIG. 2C, a first annealing process AN1 is performed on the silicon carbide wafer 100W. In some embodiments, conditions of the first annealing process AN1 include performing step S122. To be specific, step S122 includes adopting a heating rate of 10° C./min to 30° C./min, an annealing temperature of 2000° C. or less, and a constant temperature annealing time of 2 minutes or more and 4 hours or less for performing the first annealing process AN1. In this way, after performing the first annealing process AN1, as shown by step S14 of FIG. 1 and as shown in FIG. 2C, an average resistivity of the silicon carbide wafer 100W is greater than $10^{10}$ Ω·cm.

Figure 3:
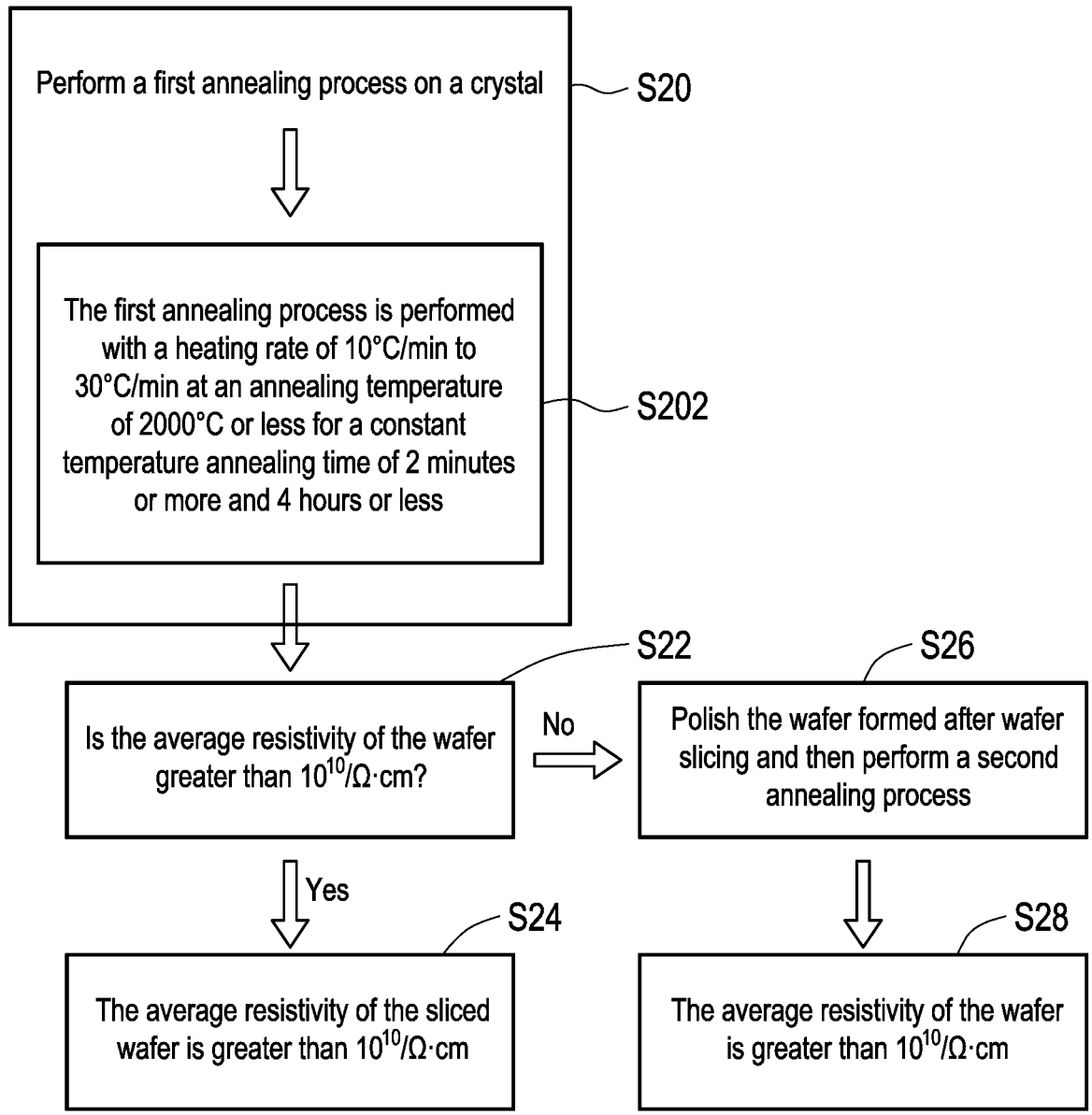
FIG. 3 is a flowchart of a method of fabricating a silicon carbide material according to another embodiment of the disclosure.
Figure 4A:
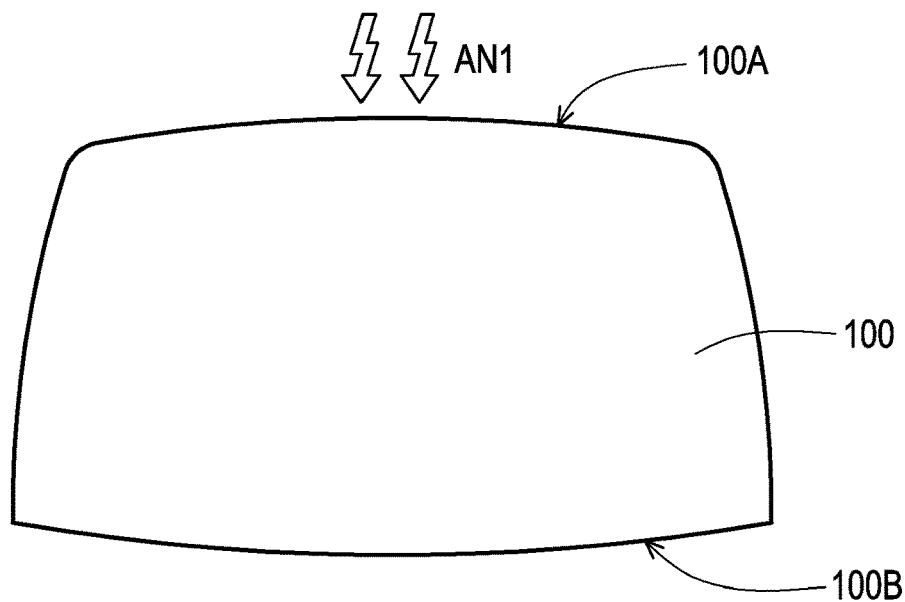
FIG. 4A to FIG. 4C are schematic cross-sectional views of the method of fabricating the silicon carbide material according to some embodiments of the disclosure.
Figure 4B:
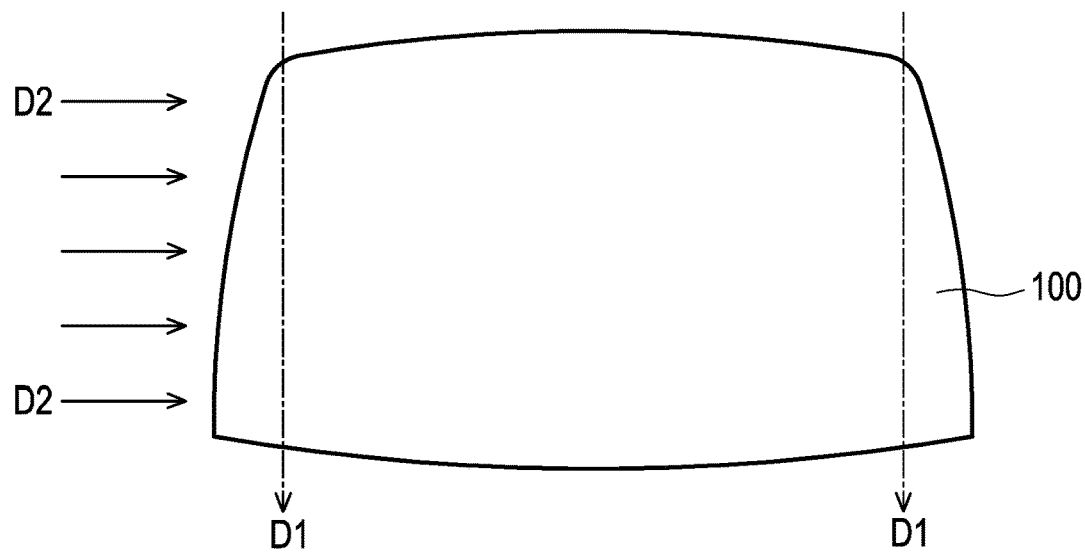
Figure 4C:
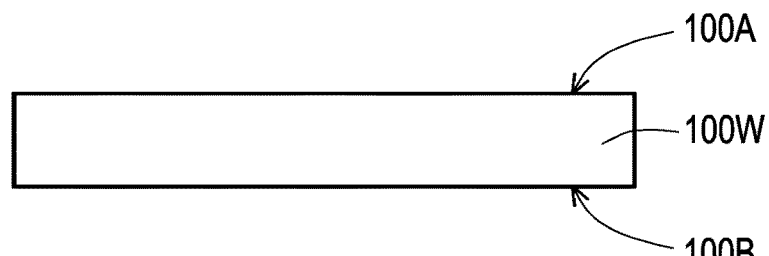
Figure 5A:
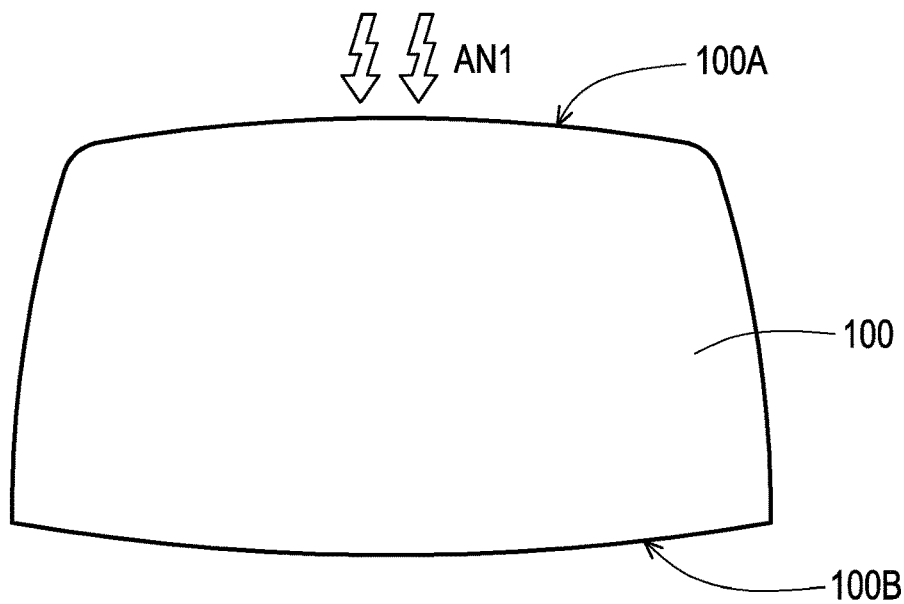
FIG. 5A to FIG. 5C are schematic cross-sectional views of the method of fabricating the silicon carbide material according to some embodiments of the disclosure.
Figure 5B:
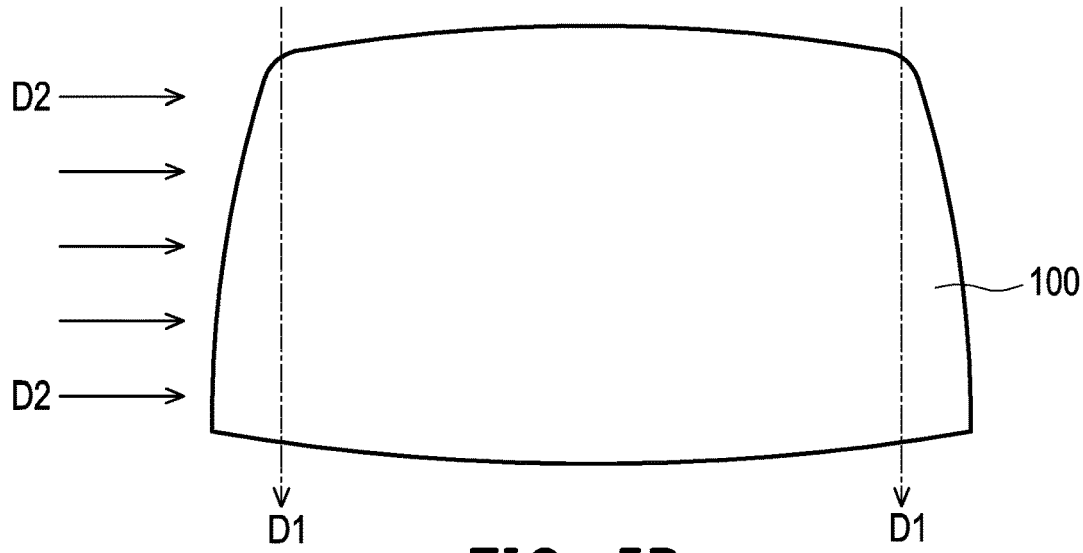
Figure 5C:
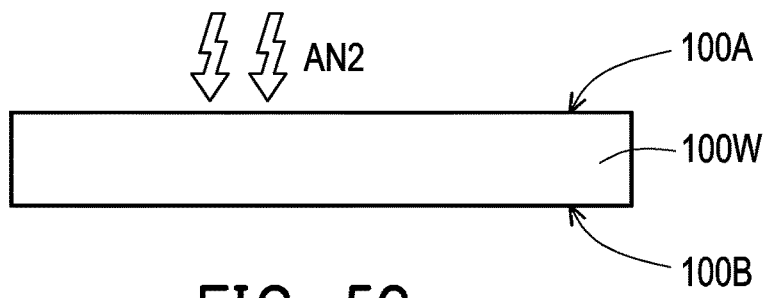

FIG. 3 is a flowchart of a method of fabricating a silicon carbide material according to another embodiment of the disclosure. FIG. 4A to FIG. 4C are schematic cross-sectional views of the method of fabricating the silicon carbide material according to some embodiments of the disclosure. FIG. 5A to FIG. 5C are schematic cross-sectional views of the method of fabricating the silicon carbide material according to some embodiments of the disclosure. Hereinafter, the method of fabricating the silicon carbide material of the embodiment of the disclosure will be described below with reference to the steps in FIG. 3 and the schematic cross-sectional views of FIG. 4A to FIG. 4C or FIG. 5A to FIG. 5C.

As shown in step S20 of FIG. 3 and FIG. 4A and FIG. 5A, the first annealing process AN1 is performed on the crystal 100 obtained through the crystal growth process. The crystal 100 shown in FIG. 4A and FIG. 5A may be obtained, for example, by a similar manufacturing process to that of the crystal 100 shown in FIG. 2A, so that details thereof are not repeated. In some embodiments, conditions of the first annealing process AN1 include performing step S202. To be specific, step S202 includes adopting a heating rate of 10° C./min to 30° C./min, an annealing temperature of 2000° C. or less, and a constant temperature annealing time of 2 minutes or more and 4 hours or less for performing the first annealing process AN1.

In some embodiments, after performing the first annealing process AN1, as shown by step S22 of FIG. 3, it is determined whether an average resistivity of the crystal 100 is greater than $10^{10}$ Ω·cm. If the average resistivity of the crystal 100 is greater than $10^{10}$ Ω·cm, the crystal 100 may be sliced directly as shown in FIG. 4B to obtain a plurality of wafers. After the crystal 100 is sliced and ground and polished, a plurality of silicon carbide wafers 100W as shown in FIG. 4C may be obtained. In this way, as shown in step S24 of FIG. 3 and FIG. 4C, the average resistivity of the silicon carbide wafer 100W formed after slicing may also be greater than $10^{10}$ Ω·cm.

In some other embodiments, if it is determined in step S22 that the average resistivity of the crystal 100 after the first annealing process AN1 still cannot satisfy the range of greater than $10^{10}$ Ω·cm, as shown in step S26 of FIG. 3 and FIG. 5B and FIG. 5C, after grinding and polishing the wafer 100W formed after slicing, a second annealing process AN2 is performed. For example, as shown in FIG. 5B, the crystal 100 is sliced to obtain a plurality of wafers. After the crystal 100 is sliced and ground and polished, a plurality of silicon carbide wafers 100W as shown in FIG. 5C may be obtained. Then, the second annealing process AN2 is performed on the silicon carbide wafers 100W.

In some embodiments, the conditions of the second annealing process AN2 include: a heating rate of 10° C./min to 30° C./min, an annealing temperature of 2000° C. or less, and a constant temperature annealing time of 2 minutes or more and 4 hours or less for performing the second annealing process AN2. In this way, as shown in step S28 of FIG. 3 and FIG. 5C, the average resistivity of the silicon carbide wafer 100W obtained after performing the second annealing process AN2 may be greater than $10^{10}$ Ω·cm.

In the aforementioned embodiment, regardless of the first annealing process AN1 or the second annealing process AN2, the annealing temperature is below 2000° C., and for example, is in an annealing temperature range of 1950° C. to 2000° C. In some preferred embodiments, the annealing temperature is in the range of 1950° C. to 1980° C. In addition, the constant temperature annealing time is 2 minutes or more and 4 hours or less, and is preferably 10 minutes or more and 3 hours or less, and most preferably 30 minutes or more and 2 hours or less. In this way, when the annealing temperature and the constant temperature annealing time are controlled within the above ranges, the resistivity of the crystal/wafer may be improved while avoiding the quality deterioration or cracking of the crystal/wafer.

In addition, in the aforementioned embodiment, regardless of the first annealing process AN1 or the second annealing process AN2, the heating rate thereof is controlled within the range of 10° C./min to 30° C./min. For example, in some embodiments, when the heating rate is within a range of 25° C./min to 30° C./min, the part of the obtained wafer 100W or the crystal 100 with the average resistivity greater than $5*10^{11}$ Ω·cm occupies 100% of an area of the wafer 100W or the crystal 100. In some embodiments, when the heating rate is within a range of 22° C./min to 26° C./min, the part of the obtained wafer 100W or the crystal 100 with the average resistivity greater than $10^{11}$ Ω·cm occupies 100% of the area of the wafer 100W or the crystal 100. In some embodiments, when the heating rate is within a range of 20° C./min to 24° C./min, the part of the obtained wafer 100W or the crystal 100 with the average resistivity greater than $5*10^{10}$ Ω·cm occupies 100% of the area of the wafer 100W or the crystal 100. In some embodiments, when the heating rate is within a range of 10° C./min to 20° C./min, the part of the obtained wafer 100W or the crystal 100 with the average resistivity greater than $10^{10}$ Ω·cm occupies 100% of the area of the wafer 100W or the crystal 100.

In this way, when the heating rate is controlled within the above range, the resistivity of the crystal/wafer may be increased while avoiding the quality deterioration or cracking of the crystal/wafer.

In order to prove that the fabrication method of the silicon carbide wafer of the disclosure may simultaneously increase the resistivity of the wafer and avoid quality deterioration or cracking of the wafer, following experimental examples are provided below for description.

Experimental Example A

In the following experimental example, the annealing process of the disclosure is performed on the wafer formed after slicing, and the average resistivity thereof is determined. Where, the annealing temperature is controlled to 1950° C., the constant temperature annealing time is 30 minutes, and the heating rate is adjusted to the range of 10° C./min to 30° C./min. Through the adjustment of the heating rate, the average resistivity of the wafer is as shown in table 1.

TABLE 1

| Group | | | | | | | |
|---|---|---|---|---|---|---|---|
| Experimental example A1 | | Experimental example A2 | | Experimental example A3 | | Experimental example A4 | |
| Heating rate (° C./min) | Percentage: resistivity range X % | Heating rate (° C./min) | Percentage: resistivity range X % | Heating rate (° C./min) | Percentage: resistivity range X % | Heating rate (° C./min) | Percentage: resistivity range X % |
| 10-20 | the part with average resistivity greater than $10^{10}$ Ω·cm occupies 80% of the area of the wafer | 20-24 | the part with average resistivity greater than $5*10^{10}$ Ω·cm occupies 80% of the area of the wafer | 22-26 | the part with average resistivity greater than $10^{11}$ Ω·cm occupies 80% of the area of the wafer | 25-30 | the part with average resistivity greater than $5*10^{11}$ Ω·cm occupies 80% of the area of the wafer |
| 10-18 | the part with average resistivity greater than $10^{10}$ Ω·cm occupies 90% of the area of the wafer | 20-23 | the part with average resistivity greater than $5*10^{10}$ Ω·cm occupies 90% of the area of the wafer | 22-25 | the part with average resistivity greater than $10^{11}$ Ω·cm occupies 90% of the area of the wafer | 25-29 | the part with average resistivity greater than $5*10^{11}$ Ω·cm occupies 90% of the area of the wafer |
| 10-16 | the part with average resistivity greater than $10^{10}$ Ω·cm occupies 100% of the area of the wafer | 20-22 | the part with average resistivity greater than $5*10^{10}$ Ω·cm occupies 100% of the area of the wafer | 22-24 | the part with average resistivity greater than $10^{11}$ Ω·cm occupies 100% of the area of the wafer | 25-27 | the part with average resistivity greater than $5*10^{11}$ Ω·cm occupies 100% of the area of the wafer |

From the experimental examples in table 1 above, it may be confirmed that when the annealing process of the disclosure is used to fabricate the silicon carbide wafers, the average resistivity of the wafers may be effectively controlled to a range greater than $10^{10}$ Ω·cm. As shown in the experimental example A1, when the heating rate is adjusted within the range of 10° C./min to 20° C./min, the part of the silicon carbide wafer with the average resistivity greater than $10^{10}$ Ω·cm may occupy 80% to 100% of the entire wafer area. As shown in the experimental example A2, when the heating rate is adjusted within the range of 20° C./min to 24° C./min, the part of the silicon carbide wafer with the average resistivity greater than $5*10^{10}$ Ω·cm may occupy 80% to 100% of the entire wafer area. As shown in the experimental example A3, when the heating rate is adjusted within the range of 22° C./min to 26° C./min, the part of the silicon carbide wafer with the average resistivity greater than $10^{11}$ Ω·cm may occupy 80% to 100% of the entire wafer area. As shown in the experimental example A4, when the heating rate is adjusted within the range of 25° C./min to 30° C./min, the part of the silicon carbide wafer with the average resistivity greater than $5*10^{11}$ Ω·cm may occupy 80% to 100% of the entire wafer area.

Experimental Example B

In order to further confirm the correlation between the annealing temperature and the resistivity of the wafer/crystal with the quality thereof, in this experimental example, the annealing process of the disclosure is performed to the crystal. Where, the constant temperature annealing time is 30 minutes, the heating rate is 10° C./min, and the annealing temperature is controlled at 1950° C., 2000° C. or 2050° C. The experimental results are shown in table 2.

TABLE 2

| Quality/<br>temperature | Experimental<br>example B1 | Experimental<br>example B2 | Experimental<br>example B3 | Experimental<br>example B4 |
|---|---|---|---|---|
| Annealing temperature | 1850° C. | 1950° C. | 2000° C. | 2050° C. |
| Crystal damage rate (%) (The surface becomes black due to carbonization) | 0% | 0% | 5% | 20% |
| Resistivity | Poor | Good | Good | Poor |

From the experimental results in table 2, it may be known that when the annealing temperatures (experimental examples B2 and B3) of the disclosure are used to perform the annealing process, the crystal may achieve better resistivity ($10^{10}$ Ω·cm or more), and meanwhile avoiding the problem of crystal damage. As shown in experimental example B2 in table 2, when the annealing temperature is controlled at 1950° C., the crystal is not damaged, and the resistivity is good ($10^{10}$ Ω·cm or more). In addition, as shown in experimental example B3 in table 2, when the annealing temperature is controlled at 2000° C., the crystal is slightly damaged, but the resistivity is still maintained good ($10^{10}$ Ω·cm or more).

In contrast, as shown in experimental example B1 in table 2, when the annealing temperature is controlled at 1850° C., the crystal cannot reach the ideal resistivity (below $10^{10}$ Ω·cm) due to that the annealing temperature is too low. In addition, as shown in experimental example B4 in table 2, when the annealing temperature is controlled at 2050° C., since the heating rate is slower than that of the a conventional method, the higher annealing temperature increases the risk of crystal damage. Therefore, the surface of the crystal will be blackened and damaged due to carbonization, which may worsen the resistivity (below $10^{10}$ Ω·cm).

Experimental Example C

In order to further confirm the correlation between the heating rate and the resistivity of the wafer/crystal, in this experimental example, the annealing process of the disclosure is performed to the wafer. Where, the annealing temperature is controlled at 1950° C., the constant temperature annealing time is 30 minutes, and the heating rate is adjusted to the range of 10° C./min to 40° C./min. The experimental results are shown in table 3.

TABLE 3

| | Experimental example C1 | Experimental example C2 | Experimental example C3 | Experimental example C4 |
|---|---|---|---|---|
| Heating rate | 10° C./min | 20° C./min | 30° C./min | 40° C./min |
| Resistivity | Good | Good | Good | Poor |

From the experimental results in table 3, it is learned that when the heating rates of the disclosure (experimental examples C1-C3) are used to perform the annealing process, the wafer may reach better resistivity (above $10^{10}$ Ω·cm). In contrast, as shown in experimental example C4 in table 3, when the heating rate is adjusted to a range of 40° C./min which is outside the limit of the disclosure, the resistivity will be worsen ($10^{10}$ Ω·cm or less).

In summary, by adopting the fabrication method of the silicon carbide material of the embodiment of the disclosure, atoms in the silicon carbide material may be arranged more orderly, and the resistivity of the wafer/crystal may be improved. In addition, by reducing the annealing temperature and the heating rate of the annealing process, and controlling the annealing temperature and the heating rate within certain ranges, the resistivity may be increased while avoiding the quality deterioration or cracking of the crystal/wafer.

What is claimed is:

1. A method of fabricating a silicon carbide material, comprising:
    performing a first annealing process on a wafer or on a crystal, wherein conditions of the first annealing process comprise:
    a heating rate of 10° C./min to 30° C./min, an annealing temperature of 1950° C. to 2000° C., and a constant temperature annealing time of 30 minutes or more and 4 hours or less for performing the first annealing process,
    wherein after performing the first annealing process, an average resistivity of the wafer or the crystal is greater than $10^{10}$ Ω·cm.

2. The method of fabricating the silicon carbide material as claimed in claim 1, wherein the first annealing process is performed on the crystal, and the average resistivity of the wafer formed by the crystal after wafer slicing is greater than $10^{10}$ Ω·cm.

3. The method of fabricating the silicon carbide material as claimed in claim 2, further comprising polishing the wafer formed after wafer slicing and then performing a second annealing process, wherein conditions of the second annealing process comprise:
    a heating rate of 10° C./min to 30° C./min, an annealing temperature of 2000° C. or less, and a constant temperature annealing time of 30 minutes or more and 4 hours or less for performing the second annealing process.

4. The method of fabricating the silicon carbide material as claimed in claim 1, wherein the first annealing process is performed on the wafer, and the first annealing process is performed on the wafer after the wafer is polished.

5. The method of fabricating the silicon carbide material as claimed in claim 1, wherein the annealing temperature ranges from 1950° C. to 1980° C.

6. The method of fabricating the silicon carbide material as claimed in claim 1, wherein the heating rate is 22° C./min to 26° C./min, and the part of the wafer or the crystal with the average resistivity greater than $10^{11}$ Ω·cm occupies 100% of an area of the wafer or the crystal.

7. The method of fabricating the silicon carbide material as claimed in claim 1, wherein the heating rate is 20° C./min to 24° C./min, and the part of the wafer or the crystal with the average resistivity greater than $5*10^{10}$ Ω·cm occupies 100% of an area of the wafer or the crystal.

8. The method of fabricating the silicon carbide material as claimed in claim 1, wherein the heating rate is 10° C./min to 20° C./min, and the part of the wafer or the crystal with the average resistivity greater than $10^{10}$ Ω·cm occupies 100% of an area of the wafer or the crystal.

9. A method of fabricating a silicon carbide material, comprising:
  performing a first annealing process on a wafer or on a crystal, wherein conditions of the first annealing process comprise:
  a heating rate of 25° C./min to 30° C./min, an annealing temperature of 1950° C. to 2000° C., and a constant temperature annealing time of 30 minutes or more and 4 hours or less for performing the first annealing process,
  wherein after performing the first annealing process, a part of the wafer or the crystal with an average resistivity greater than $5*10^{11}$ Ω·cm occupies 100% of an area of the wafer or the crystal.

* * * * *